(12) United States Patent
Walkington

(10) Patent No.: US 7,893,787 B2
(45) Date of Patent: Feb. 22, 2011

(54) DC OFFSET CANCELLATION CIRCUIT FOR MODULATOR USING 1-BIT SIGNAL CONVERSION

(75) Inventor: Robert Walkington, Minato-ku (JP)

(73) Assignee: NEC Corporation, Tokyo (JP)

(*) Notice: Subject to any disclaimer, the term of this patent is extended or adjusted under 35 U.S.C. 154(b) by 457 days.

(21) Appl. No.: 11/996,477

(22) PCT Filed: Aug. 19, 2005

(86) PCT No.: PCT/JP2005/015494

§ 371 (c)(1),
(2), (4) Date: Apr. 3, 2008

(87) PCT Pub. No.: WO2007/020714

PCT Pub. Date: Feb. 22, 2007

(65) Prior Publication Data
US 2009/0261918 A1 Oct. 22, 2009

(51) Int. Cl.
*H03C 1/06* (2006.01)
(52) U.S. Cl. .............. 332/103; 332/167; 332/162; 455/126; 455/115.1; 455/109
(58) Field of Classification Search .......... 332/103, 332/104, 149, 150, 155, 156, 157, 158, 159, 332/161, 162, 167; 455/108, 109, 115.1, 455/126, 125; 375/298, 300, 301
See application file for complete search history.

(56) References Cited

U.S. PATENT DOCUMENTS

| | | | |
|---|---|---|---|
| 5,012,208 A | 4/1991 | Mäkinen et al. | |
| 6,618,096 B1 * | 9/2003 | Stapleton | 348/608 |
| 6,704,551 B2 * | 3/2004 | Riou et al. | 455/115.1 |
| 6,937,847 B2 * | 8/2005 | Ehrenreich et al. | 455/115.1 |
| 7,382,833 B1 * | 6/2008 | Peterson et al. | 375/296 |
| 2002/0018531 A1 | 2/2002 | Ratto | |
| 2002/0115416 A1 | 8/2002 | Riou et al. | |

FOREIGN PATENT DOCUMENTS

| | | |
|---|---|---|
| JP | 7-58555 A | 3/1995 |
| JP | 8-78967 A | 3/1996 |
| JP | 9-307596 A | 11/1997 |
| JP | 10-70582 A | 3/1998 |
| JP | 11-220506 A | 8/1999 |
| JP | 2000-101662 A | 4/2000 |

(Continued)

*Primary Examiner*—Robert Pascal
*Assistant Examiner*—Ryan Johnson
(74) *Attorney, Agent, or Firm*—Sughrue Mion, PLLC

(57) ABSTRACT

A DC offset cancellation circuit used for compensating a carrier leak at an output signal of a modulator has a sign extraction unit for extracting sign of an information signal which is applied to the modulator, an envelope detecting unit for performing envelope detection on the output signal of the modulator to output the resulting envelope, a slope detecting unit for performing polarity detection on the slope of the envelope; and a signal processing unit for generating a DC offset cancellation signal for compensating the carrier leak based on the result of the sign extraction and the result of the polarity detection. The signal processing unit preferably calculates the DC offset cancellation signal by multiplying the sign of the information signal by the polarity of the slope of the envelope and accumulating the result of multiplication.

18 Claims, 8 Drawing Sheets

FOREIGN PATENT DOCUMENTS

| | | |
|---|---|---|
| JP | 2000-101663 A | 4/2000 |
| JP | 2000-261252 A | 9/2000 |
| JP | 2001-177585 A | 6/2001 |
| JP | 2002-77285 A | 3/2002 |
| JP | 2002-198745 A | 7/2002 |
| JP | 2003-125014 A | 4/2003 |
| JP | 2004-7099 A | 1/2004 |
| JP | 2004-289576 A | 10/2004 |

* cited by examiner

US 7,893,787 B2

DC OFFSET CANCELLATION CIRCUIT FOR MODULATOR USING 1-BIT SIGNAL CONVERSION

TECHNICAL FIELD

The present invention relates to cancellation of DC offsets in mixers and modulators such as carrier-suppressed direct conversion modulators.

BACKGROUND ART

Mixers and modulators are devices which modulate low frequency signals or baseband signals onto a higher frequency carrier for transmission purposes. One type of modulators is an AM (amplitude modulation) modulator, where the lower frequency data is modulated onto amplitude of the higher frequency carrier. The operation of such an AM modulator can be depicted as a simple multiplication of the lower and higher frequency signals. The AM modulator is also referred to as an AM mixer. A typical AM modulator has a local oscillation (LO) signal input to which the carrier signal (i.e., local oscillation signal) is applied, a signal input to which the low frequency signal is applied, and an output for providing a modulated signal. A particular disadvantage of the basic AM modulator is that the output signal contains the higher frequency carrier signal, which carries no useful information and uses transmission power.

A modified form of modulator, known as a double sideband suppressed carrier (DSBSC) modulator is shown in FIG. 1A. The DSBSC modulator is also referred to as a DBM (double balanced mixer). The illustrated DSBSC modulator has current source 101, six transistors M1 through M6, a pair of balanced input terminals 102, 103 to which a baseband signal is applied, a pair of balanced input terminals 104, 105 to which a local oscillation (LO) signal is applied, and a pair of balanced output terminals 106, 107 from which the modulated signal is delivered as a current output. Transistors M1 through M3 constitute a first AM mixer while transistors M4 through M6 constitute a second AM mixer. One end of current source 101 is connected to the ground potential point, and sources of transistors M1, M4 are commonly connected to the other end of current source 101 so that the first and second AM mixers share current source 101. In the first AM mixer, a gate of transistor M1 is connected to non-inverting input terminal 102 of the baseband signal, and a drain of transistor M1 is connected to sources of transistors M2, M3. Gates of transistor M2, M3 are connected to inverting input terminal 105 and non-inverting input terminal 104, respectively, and drains of transistors M2, M3 are connected to inverting output terminal 107 and non-inverting output terminal 106 of this DSBSC modulator, respectively. In the second AM mixer, a gate of transistor M4 is connected to inverting input terminal 103 of the baseband signal, and a drain of transistor M4 is connected to sources of transistors M5, M6. Gates of transistor M5, M6 are connected to non-inverting input terminal 104 and inverting input terminal 105, respectively, and drains of transistors M5, M6 are connected to inverting output terminal 107 and non-inverting output terminal 106 of this DSBSC modulator, respectively.

This type of modulator can suppress the carrier signal at the output by cancelling the local oscillation components at the two AM mixer outputs, which is possible because the two oscillator signals are applied in opposing phases. This arrangement is commonly used because of the increased efficiency.

As well known to those skilled in the art, an example of applications of the DSBSC modulator is a quadrature (IQ) modulator which is used for orthogonal amplitude modulation and/or demodulation. As shown in FIG. 1B, a typical quadrature modulator comprises signal input terminals 111, 112 for first and second signals, respectively, LO input terminal 113 for receiving a local oscillation (LO) signal, phase shifter 114 for shifting phase of the local oscillation signal by 90 degrees, first and second DSBSC modulators 115, 116 for receiving the first and second signals, respectively, combiner 117 for adding the outputs of both DSBSC modulators 115, 116, and RF output terminal 118 connected to the output of combiner 117. The local oscillation signal is directly supplied to first DSBSC modulator 115 from LO input terminal 113 while second DSBSC modulator 116 receives the local oscillation signal through phase shifter 114. In such a quadrature modulator, the first signal corresponds to an I (in-phase) component of the output modulated signal while the second signal corresponds to a Q (quadrature) component. Therefore, the first signal is also referred to as an I signal and the second signal a Q signal.

A problem with the fabrication of DSBSC modulators arises due to the carrier suppression requirement. This typically arises due to unavoidable manufacturing tolerances of the two AM mixers, which are usually implemented as parts of a monolithic chip such as a semiconductor integrated circuit device. If there is imperfect matching of the transistors in the DSBSC modulator, then not only the sidebands of the modulated signal are transmitted, but also a leak at the local oscillator frequency, equivalent to a DC offset at the output of the DSBSC modulator is transmitted. Such a carrier leak is undesirable as it makes it difficult to capture the phase of the transmitted signal during demodulation, and can also cause undesired interference with other communications.

Efforts to fix this problem can involve adding a configuration for applying a static DC offset to the modulator input in order to cancel the carrier signal. For example, Japanese Patent Laid-open Application No. 2002-198745 (JP, P2002-198745A) discloses an arrangement in which a DC offset voltage is applied to a local oscillation input terminal. However this approach cannot account for the long-term drift in the circuit parameters and operating temperature.

An additional approach is to increase the physical size of the transistors in the circuit to reduce relative variations in the parameters of the transistors, but this is unsuitable for high frequency circuitry as the increased parasitic capacitance reduces the gain at the carrier frequency. In addition, special layout techniques can also be used to cancel the process error gradient across the chip surface, but in practice this method increases the circuit area and cost and may still not give enough carrier suppression.

In U.S. Pat. No. 5,012,208 issued to Makinen et al., a solution for the problem of local oscillation signal leak (i.e., DC offset) in a quadrature modulator is disclosed. FIG. 2 illustrates an arrangement of the circuit of Makinen et al. which solves the problem of quadrature modulator DC offset cancelling. In this circuit, an output of quadrature modulator 121 is supplied to amplifier 122, and the output of amplifier 122 is supplied to RF output terminal 123 and power measuring circuit 124. Power measuring circuit 124 provides an envelope of the transmitted RF signal from amplifier 122. The output of power measuring circuit 124 is supplied to amplifier 125 through high pass filter 126. Linear correlators 127, 128 correlate the I (in-phase) and Q (quadrature) input signals received at input terminals 129, 130 with the output signal of amplifier 125, respectively. The outputs of correlators 127, 128 are integrated by integrators 131, 132. Subtractor 133 subtracts the output of integrator 131 from the I input signal received at input terminal 129 and supply the result to quadrature modulator 121 as an I signal. Similarly, subtractor 134 subtracts the output of integrator 132 from the Q input signal received at input terminal 130 and supply the result to quadrature modulator 121 as a Q signal.

This approach calculates error signals using the envelope of the transmitted RF signal and the time domain signals at the I and Q inputs. By correlating the envelope signal with the input signals in the linear correlators, and integrating the results, error signals are extracted to compensate the modulator offsets. The two error signals are separately derived from the single envelope signal due to the correlation over a long time period between the average DC level of the I and Q input signals and the average peak level of the envelope signal in the I and Q phase domains.

An essential component of the system of FIG. 2 is a linear multiplier (correlator) with a very low DC offset. Any large DC offset of this component will prevent the full cancellation of the DC offsets of the modulator. Typically, the system of FIG. 2 would be difficult to implement purely in the analog domain due to the requirement of a linear analog multiplier with a low DC offset. Such circuits tend to be complicated and therefore difficult to implement with the required accuracy for this application. Therefore the system of FIG. 2 would be expected to be implemented in the digital domain apart from the section of the loop from the quadrature modulator to the power measuring circuit and the amplifier. Implementing the system in the digital domain requires an ADC (analog-to-digital converter) to convert the signal at the amplifier output. However, the provision of the ADC carries much production overhead and implementation cost.

Therefore, it is desired to provide an error calculation circuit which generates an error compensation signal to be applied to a mixer or a modulator, has a simple circuit structure, and is easily manufactured.

Japanese Patent Laid-open Application No. 9-307596 (JP, 9-307596, A) discloses an arrangement in which a cancel carrier signal is generated and added to the modulated carrier signal.

Japanese Patent Laid-open Application No. 2000-261252 (JP, P2000-261252A) discloses a distortion compensation circuit for an RF power amplifier in which a result of envelope detection of an input signal is used for compensating distortion components in an output of the amplifier.

Japanese Patent Laid-open Application No. 10-70582 (JP, 10-070582, A) discloses an arrangement for reducing the leak carrier in a quadrature modulator by generating a beat signal between a modulated signal and an local oscillation signal, detecting the beat signal and generating a DC offset signal (i.e., error compensation signal) based on the detection result.

Japanese Patent Laid-open Application No. 11-220506 (JP, 11-220506, A) discloses an arrangement for reducing the leak carrier in a quadrature modulator output. In this arrangement, a local oscillation signal is doubled in frequency and separated to quadrature phase components. These phase components are modulated and then combined.

Japanese Patent Laid-open Application No. 2003-125014 (JP, P2003-125014A) discloses a quadrature modulator in which DC offset voltages are added to I and Q balanced input signals.

DISCLOSURE OF THE INVENTION

An object of the present invention is to provide a DC offset cancellation circuit which generates a DC offset cancellation signal to be applied to a mixer or a modulator, has a simple circuit structure, and is manufactured without difficulties.

Another object of the present invention is to provide a modulator which can reduce influences of a DC offset at the output of the modulator and be fabricated without difficulties.

A further object of the present invention is to provide a modulator which can reduce the carrier leak at the output of the modulator and be fabricated without difficulties.

The present invention provides a way to automatically compensate the DC offset of a modulator such as a DSBSC modulator by measuring only the sign of the input signal and the digitized ripple polarity of the RF envelope of the output of the modulator.

The object of the present invention is achieved by a DC offset cancellation circuit for a modulator, comprising a sign extraction unit for extracting sign of an information signal which is applied to the modulator, an envelope detecting unit for performing envelope detection on the output signal of the modulator to output the resulting envelope signal, a slope detecting unit for performing polarity detection on a slope of the envelope signal, and a signal processing unit for generating a DC offset cancellation signal based on the result of the sign extraction and the result of the polarity detection.

In the present invention, the DC offset cancellation signal is preferably applied to the modulator for compensating the DC offset of the modulator. The information signal is a signal conveying information. A typical information signal is, but not limited to, a baseband signal.

The second object of the present invention is achieved by a modulator module comprising a modulator and a DC offset cancellation circuit, wherein the DC offset cancellation circuit includes a sign extraction unit for extracting sign of an information signal which is applied to the modulator, an envelope detecting unit for performing envelope detection on a signal supplied from the modulator to output the resulting envelope signal, a slope detecting unit for performing polarity detection on a slope of the envelope signal; and a signal processing unit for generating a DC offset cancellation signal based on the result of the sign extraction and the result of the polarity detection, the DC offset cancellation signal being fed to the modulator.

The DC offset cancellation according to the present invention relies on the fact that a DC offset in the signal at the modulator output causes a ripple in the envelope of the modulated signal, which can be measured using an envelope detector. By combining the output of the envelope detector with the sign of the input signal to the modulator, it is possible to obtain the mean DC offset of the modulated signal to allow a DC offset cancellation signal to be applied to the modulator. An additional simplification is possible by realizing that for the purposes of offset cancellation only the mean of the ripple polarity of the modulator output is required. The ripple polarity may be detected by comparing the mean and instantaneous values of the envelope detector output. This allows the ripple to be converted into a single bit pattern whose duty cycle reflects the DC ripple in the carrier output, allowing a simplified digital implementation.

In order to extract the DC errors during the modulator operation, the system multiplies the instantaneous ripple polarity (increasing or decreasing) of the RF carrier, measured by an envelope detector, with the instantaneous sign of the input signal to obtain an error signal. By integrating this error signal over a long enough time period, an estimate is obtained for the DC offset which can be applied to a suitable compensating input built into the modulator. The slow adaptation of the error signal while the modulator is in use means no special calibration sequence is necessary.

The above and other objects, features, and advantages of the present invention will become apparent from the following description with reference to the accompanying drawings which illustrate an example of the present invention.

BEST MODE FOR CARRYING OUT THE INVENTION

Figure 3:
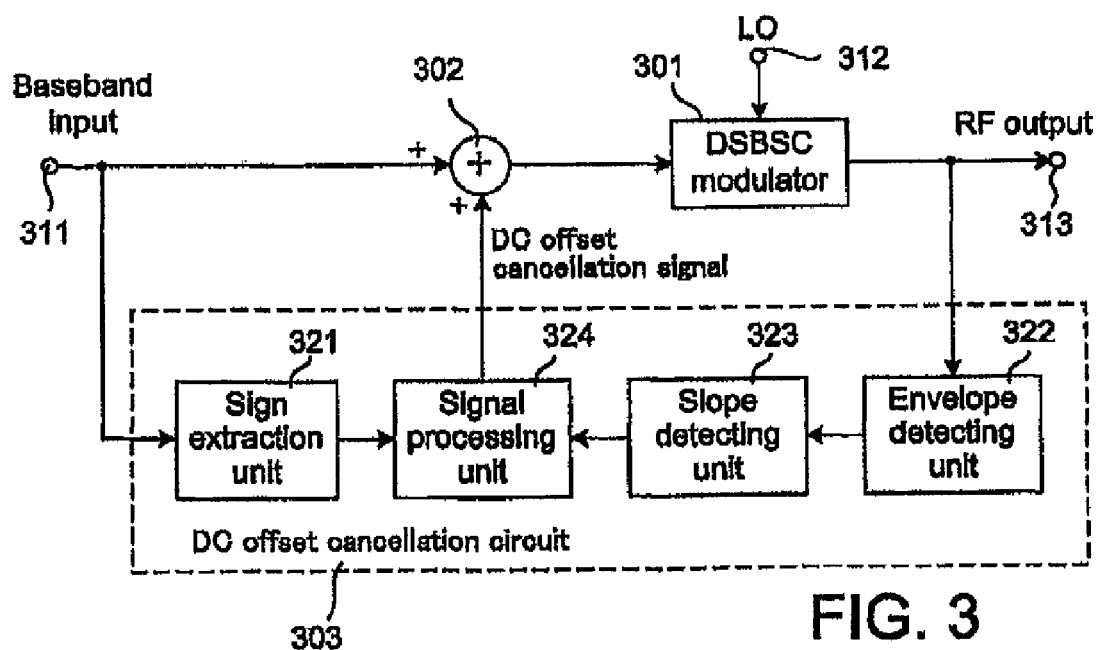
FIG. 3 is a block diagram illustrating a DSBSC modulator module according to the present invention in which a DC offset cancellation circuit is connected to a DSBSC modulator.

As shown in FIG. 3, a modulator module according to an embodiment of the present invention which can suppress carrier leak has DSBSC modulator 301, adder 302, and DC offset cancellation circuit 303. DSBSC modulator 301 is supplied with a baseband signal, which is applied to input terminal 311, through adder 302, and also supplied with a local oscillation signal which is applied to input terminal 312. DSBSC modulator 301 generates an RF output signal in which the local oscillation signal is modulated by the baseband signal. The RF output signal is fed to RF output terminal 313. DC offset cancellation circuit 303 is supplied with the baseband signal and the RF output signal and generates a DC offset cancellation signal. The DC offset cancellation signal is supplied to adder 302. Consequently, DSBSC modulator 301 receives the baseband signal to which the DC offset cancellation signal is added.

DC offset cancellation circuit 303 is generally provided with sign extraction unit 321 for detecting instantaneous sign or polarity of the baseband signal, envelope detecting unit 322 for performing envelope detection on the RF output signal from DSBSC modulator 301 to output the resulting envelope signal, slope detecting unit 323 for performing polarity detection on a slope of the envelope signal; and signal processing unit 324 for generating the DC offset cancellation signal based on the result of the sign extraction in sign extraction unit 321 and the result of the polarity detection in slope detecting unit 323.

One possible way to implement sign extraction unit 321 would be use of a comparator which outputs a binary signal in accordance with the instantaneous polarity or sign of the input baseband signal. Envelope detecting unit 322 may comprise a simple AM detector or AM detection circuit. Slope detecting unit 323 outputs the ripple polarity of the modulator output signal. Slope detecting unit 323 may comprise a comparator having a non-inverting input terminal to which the output of envelope detecting unit 322 is directly applied and an inverting input terminal to which a temporally smoothed output of envelope detecting unit 322.

Signal processing unit 324 may have a calculator for successively calculating instantaneous DC errors of the modulator output, and an accumulator or integrator for accumulating the DC errors. Since each of the ripple polarity and the sign of the input background signal is represented by a 1-bit digital value, the calculator and accumulator can be constructed by digital circuits. For example, the calculator can be a circuit which digitally multiplies the instantaneous ripple polarity (increasing or decreasing) of the RF carrier with the instantaneous sign of the input baseband signal. In such a digital configuration, signal processing unit 324 may have a digital-to-analog converter (DAC) for converting the digital data supplied from the accumulator or integrator to the analog DC offset cancellation signal. In this signal processing unit 324, an estimate for the DC offset of the modulator is obtained by accumulating or integrating the error signal over a long enough time period. The slow adaptation of the error signal while the modulator is in use means no special calibration sequence is necessary.

The DC offset cancellation in this modulator module relies on the fact that a DC offset in the RF output signal from DSBSC modulator 301 causes a ripple in the envelope of the RF output signal, which can be measured using envelope detecting unit 322. By combining the output of envelope detecting unit 322 with the sign of the baseband input signal to DSBSC modulator 301, it is possible to obtain the mean DC offset of the RF output signal to allow a DC offset cancellation signal to be applied to DSBSC modulator 301. An additional simplification is possible by realizing that for the purposes of offset cancellation only the mean of the ripple polarity of the RF output signal is required. The ripple polarity is detected in slope detecting unit 323 by comparing the mean and instantaneous values of the output of envelope detecting unit 322. This allows the ripple to be converted into a single bit pattern whose duty cycle reflects the DC ripple in the carrier output, allowing a simplified digital implementation.

Figure 4A:
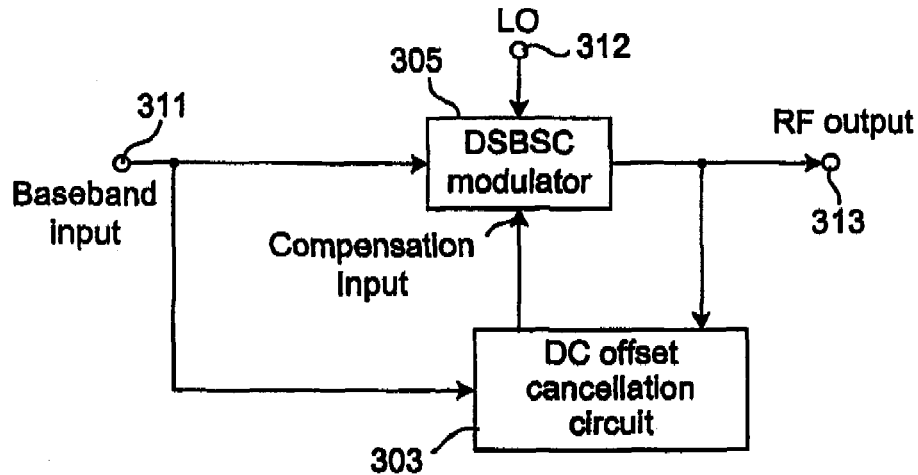
FIG. 4A is a block diagram illustrating a DSBSC modulator module according to the present invention in which a DC offset cancellation circuit is connected to a compensation input of a DSBSC modulator.
Figure 4B:
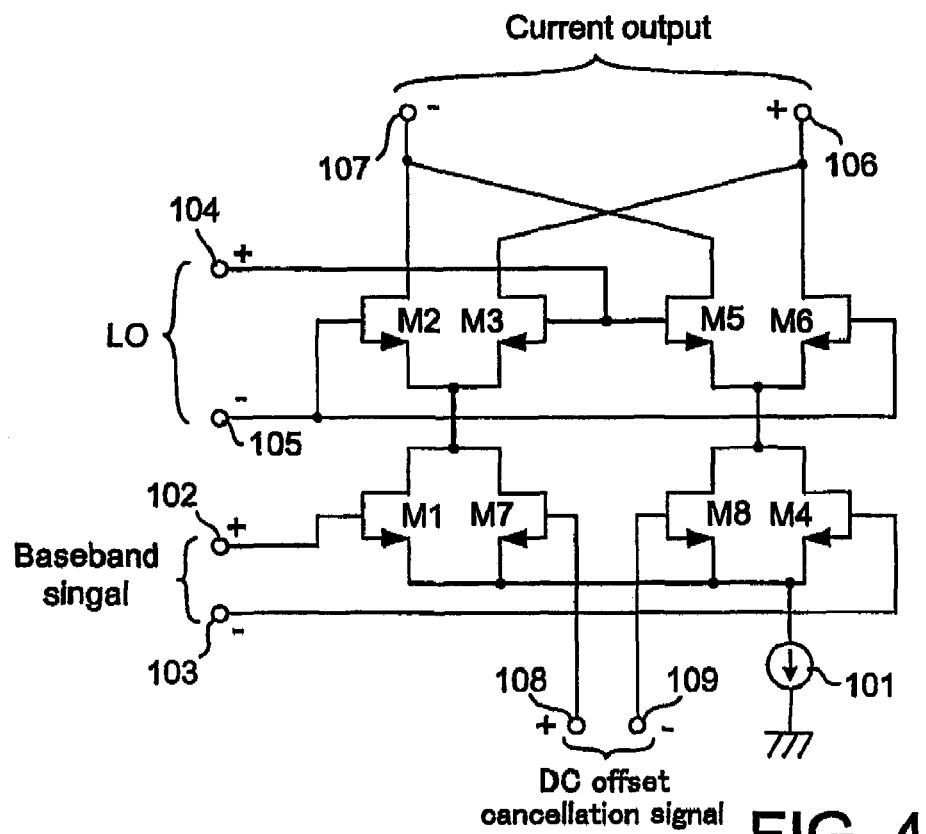
FIG. 4B is a circuit diagram illustrating an example of a DSBSC modulator having a compensation input.

FIG. 4A illustrates another modulator module according the present invention. This modulator module is different from the modulator module shown in FIG. 3 in that the DSBSC modulator has a compensation input. In the modulator module shown in FIG. 4, DSBSC modulator 305 is supplied with the baseband signal and the local oscillation signal and generates an RF output signal. DC offset cancellation circuit 303 is supplied with the baseband signal and the RF output signal and generates a DC offset cancellation signal. The DC offset cancellation signal is supplied to the compensation input of DSBSC modulator 305, and the carrier leak from DSBSC modulator 305 is suppressed.

Figure 1A:
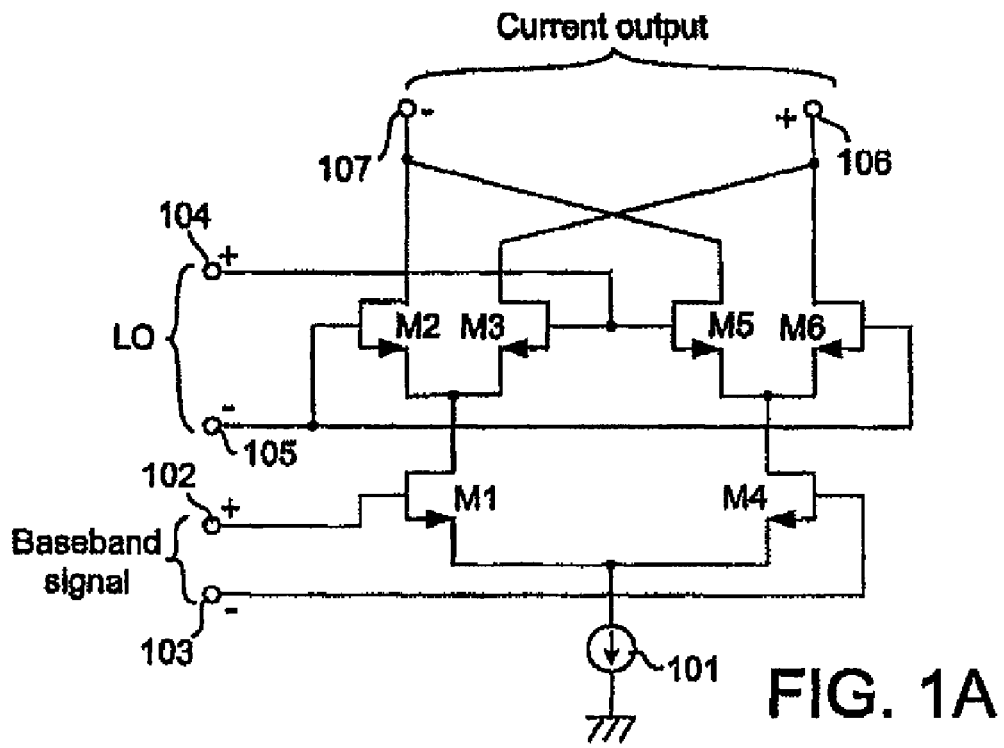
FIG. 1A is a circuit diagram illustrating a typical circuit level implementation of a DSBSC (double sideband suppressed carrier) modulator.
Figure 1B:
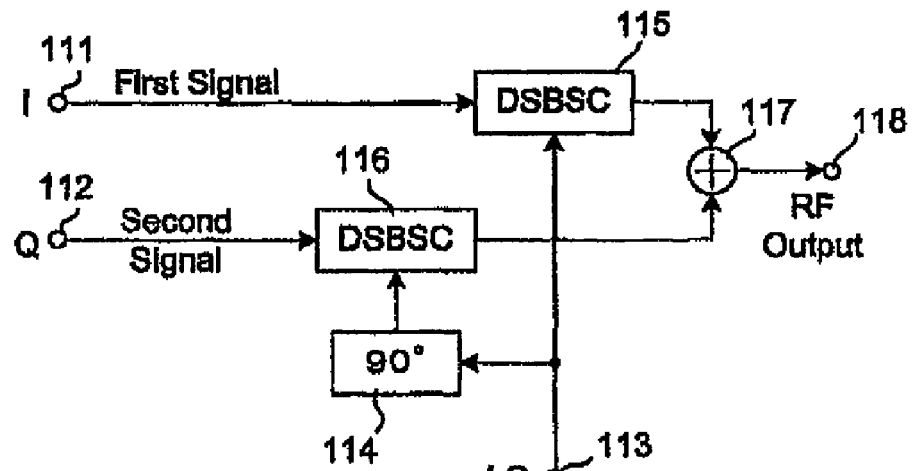
FIG. 1B is a block diagram illustrating a typical quadrature (IQ) modulator as a pair of DSBSC modulators driven by orthogonal local oscillator signals.
Figure 2:
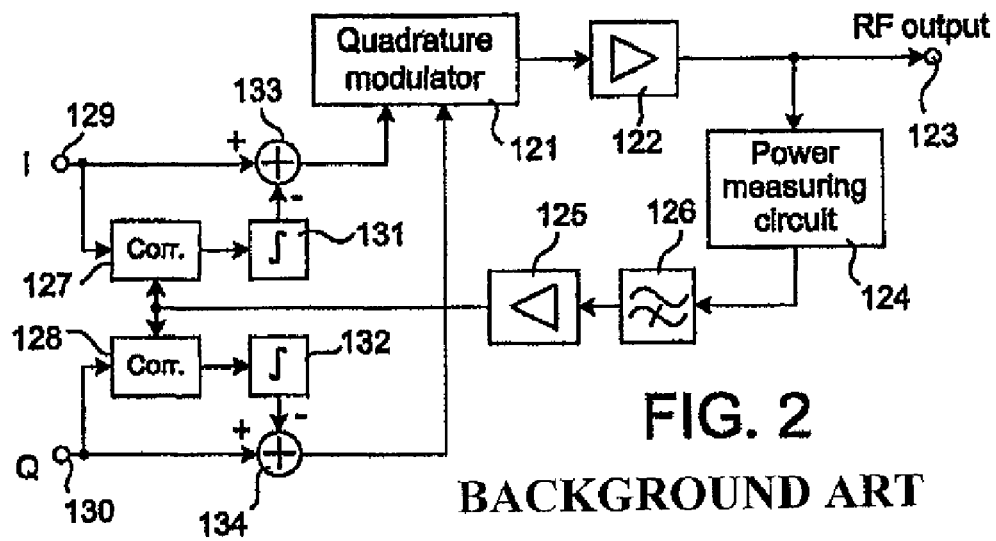
FIG. 2 is a block diagram illustrating a prior art arrangement of a quadrature modulator with local oscillator leak suppression.

Here, a DSBSC modulator having a compensation input will be described. The DSBSC modulator shown in FIG. 4B differs from the modulator shown in FIG. 1A in that the former modulator has additional transistors M7, M8. Transistor M7 has a source and drain connected to the source and drain of transistor M1, respectively, while transistor M8 has a source and drain connected to the source and drain of transistor M4, respectively. A gate of transistor M7 is connected to non-inverting compensation input terminal 108 and a gate of transistor M8 is connected to inverting compensation input terminal 109. In this arrangement, compensation input terminals 108, 109 are built-in compensation terminals of the modulator. A balanced DC offset cancellation signal is applied to compensation input terminals 108, 109. The effect of the application of the DC offset cancellation signal to the DSBSC modulator is equivalent effect to that of the addition of the DC offset cancellation signal to the input signal of the modulator shown in FIG. 1A. If the DC offset cancellation signal is an unbalanced signal, such an unbalanced signal is applied to one of input terminals 108, 109 while a DC bias voltage is applied the other input terminal.

Figure 5:
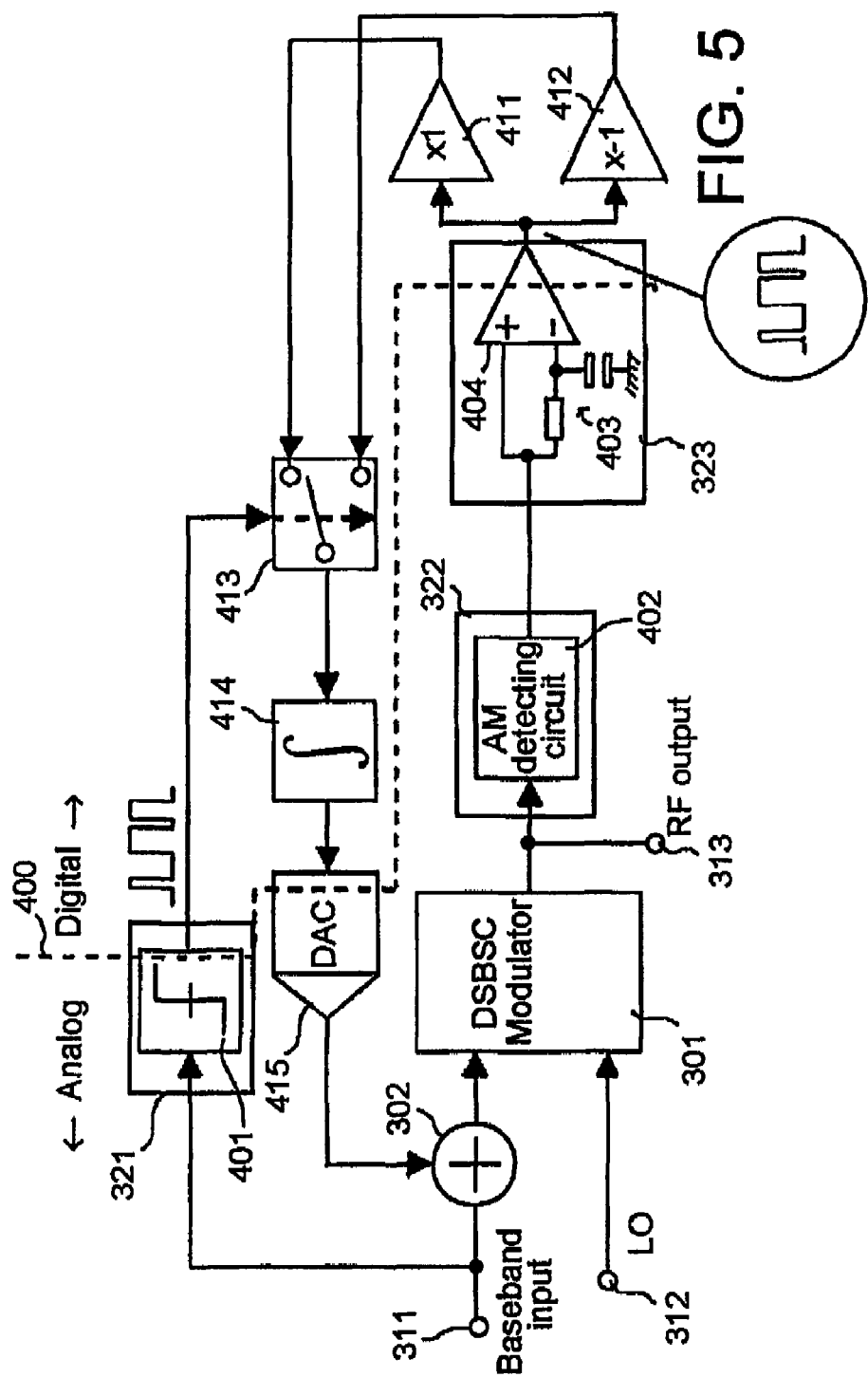
FIG. 5 is a diagram illustrating an implementation of the arrangement illustrated in FIG. 3.

FIG. 5 illustrates a specific implementation of the modulator module shown in FIG. 3.

As described above, the modulator module has DSBSC modulator 301, adder 302, sign extraction unit 321, envelope detecting unit 322, slope detecting unit 323 and the signal processing unit. Sign extraction unit 321 has comparator 401 for detecting instantaneous sign or polarity of the baseband signal, and envelope detecting unit 322 comprises AM detecting circuit 402 for performing envelope detection on the RF output signal from DSBSC modulator 301. Slope detecting unit 323 has low pass filter 403 and saturating comparator 404. Comparator 404 has a non-inverting input terminal to which the output of envelope detecting unit 322 is directly applied to and an inverting input terminal to which the output of envelope detecting unit 322 is supplied through low pass filter 403.

The signal processing unit has non-inverting amplifier 411 having amplification factor of 1, inverting amplifier 412 having amplification factor of −1, switch 413 controlled by the output of sign extraction unit 321, digital integrator block or accumulator 414 for accumulating the output of switch 413, and digital-to-analog converter (DAC) 415 which converts the accumulated digital value of accumulator 414 into an analog signal. This analog signal is the DC offset cancellation signal and applied to adder 302. The output of slope detecting circuit 323, that is, the output of comparator 404, is applied to both non-inverting amplifier 411 and inverting amplifier 412. Switch 413 selects one of the outputs of non-inverting amplifier 411 and inverting amplifier 412 in accordance with the output of sign extraction unit 321.

In FIG. 5, the circuitry in left side of dashed line 400 is implemented by an analog circuit section and the circuitry in right side of dashed line 400 is implemented by a digital circuit section.

The detailed operation of the modulator module shown in FIG. 5 is as follows: The RF output signal of DSBSC modulator 301 enters envelope detecting unit 322, which recovers the envelope of the transmitted RF signal. The resulting envelope signal then splits into two paths. One path directly feeds the non-inverting input of saturating comparator 404, whilst the other path connects to the comparator inverting input via low pass filter 403. Comparator 404 supplies binary signals of +1 or −1. In this way the inverting input of comparator 404 floats at a DC level equivalent to the average level of the RF signal envelope, whilst the non-inverting input responds to the instantaneous envelope value. The output signal of comparator 404 can thus either be positive or negative by some fixed amount. This stream of signals contains the information about whether the envelope level has risen or fallen in each clock period of comparator 404. The binary signal stream from the output of comparator 404 is then fed into both inverting and non-inverting amplifiers 411, 412, resulting in two output signal paths. Either the inverted or non-inverted amplifier output is selected by switch 413 which is controlled by the sign control input from sign extraction unit 321. The output of switch 413 is the instantaneous gradient of the envelope signal multiplied by the input signal sign, which is accumulated over successive periods by accumulator 414. The accumulator output provides a DC offset cancellation signal which can be fed to the modulator to cancel the carrier signal at the output of the modulator. Additionally, because the feedback loop contains an integrator (i.e., accumulator), the system is able to converge to a zero final error condition.

The modulator module shown in FIG. 5 is free from an analog-to-digital converter (ADC). This leads a reduced implementation difficulty and cost.

Figure 6:
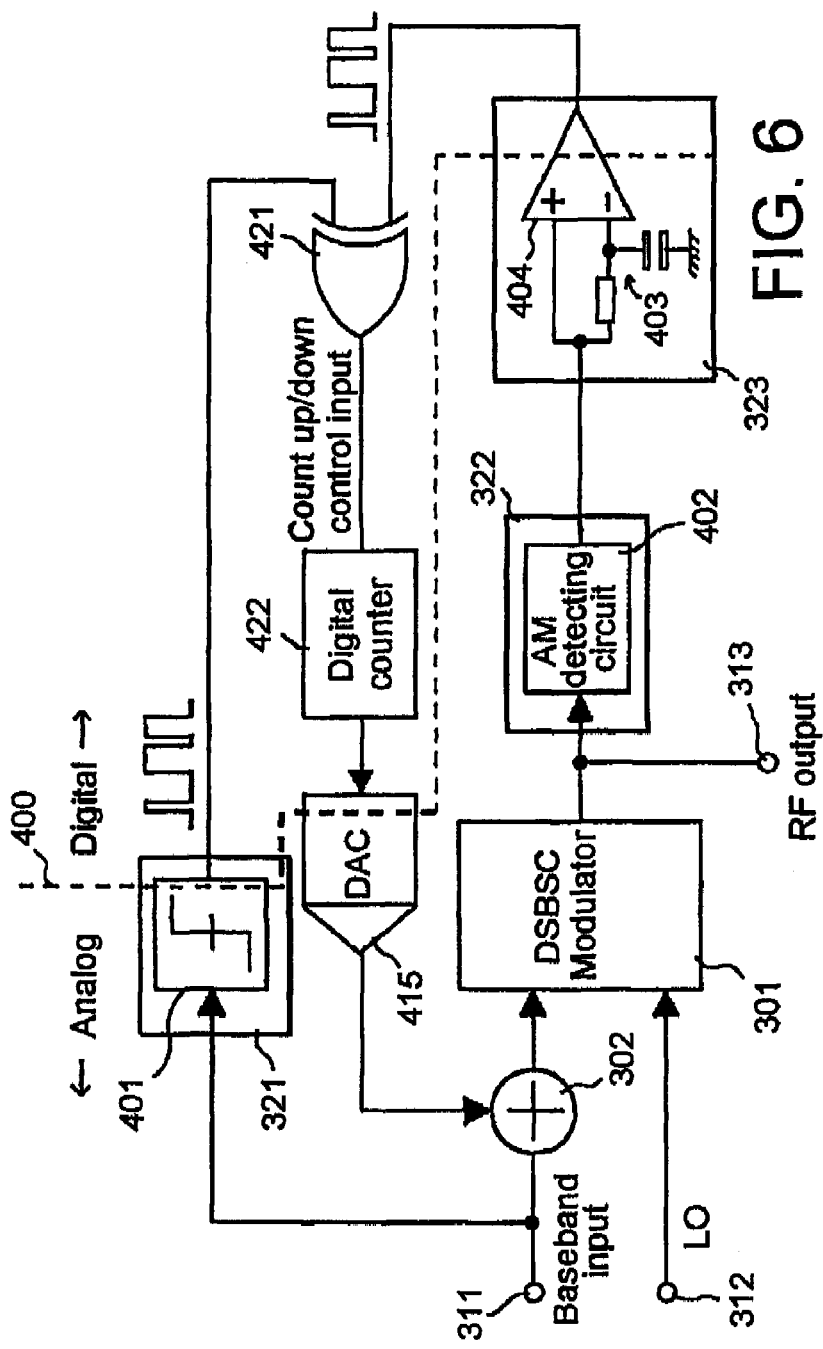
FIG. 6 is a diagram illustrating another implementation of the arrangement illustrated in FIG. 3.

FIG. 6 illustrates another specific implementation of the modulator module shown in FIG. 3.

The modulator module shown in FIG. 6 is different form the modulator module shown in FIG. 5 in that the switch and the accumulator are replaced with digital XOR (exclusive OR) gate 421 and digital counter 422. Therefore, the signal processing unit shown in FIG. 6 has digital XOR gate 421, digital counter 422 and DAC 415. It is assumed in the case of FIG. 6 that all comparator outputs are logic signals of 0 or 1, instead of the case of FIG. 5 where the comparator outputs are binary signals of +1 or −1.

The output of comparator 404 in slope detecting unit 323 is applied one input terminal (Input A) of XOR gate 421 whilst the other input terminal (Input B) of XOR gate 421 receives the output signal of sign extraction unit 321. XOR gate 421 operates in accordance with the following logic truth table:

TABLE 1

| Input A | Input B | Output |
|---------|---------|--------|
| 0 | 0 | 0 |
| 0 | 1 | 1 |
| 1 | 0 | 1 |
| 1 | 1 | 0 |

Digital counter 422 is an up/down counter supplied with a certain clock signal (not shown) and performs either of up-counting or down-counting of the clock signal. The up or down count direction of counter 422 is controlled by the output of XOR gate 421.

In this arrangement, digital counter 422 successively counts up or down the clock signal. The direction of the counting operation of counter 422 is controlled by the output of XOR gate 421 which is supplied with the result of sign extraction on the input baseband signal and the slope polarity of the RF output signal, so that over a period of time the average of output of counter 422 is zero if no carrier leak exists in the output of DSBSC mixer 202.

This digital gate implementation shown in FIG. 6 has the same functionality as the circuit implementation of FIG. 5 with the advantage of simpler implementation with minimized circuitry.

Figure 7:
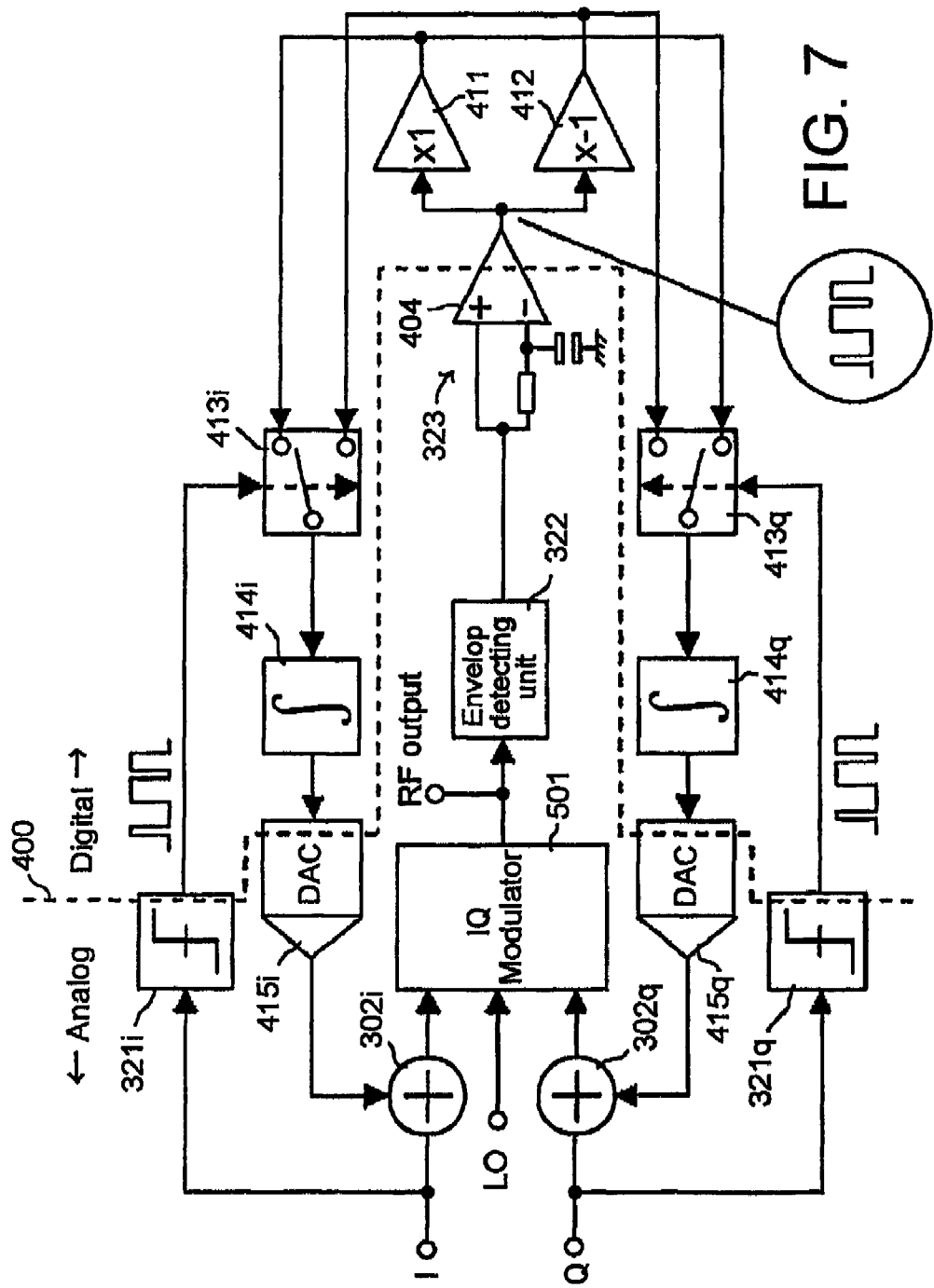
FIG. 7 is a diagram illustrating a quadrature modulator module in which the DC offset cancellation circuits are installed.

The present invention is also applied to a quadrature (IQ) modulator. FIG. 7 illustrates a quadrature modulator module in which the DC offset cancellation circuit is installed. The DC offset cancellation circuit used in this example is an extended version of the DC offset cancellation circuit shown in FIG. 5.

Quadrature modulator 501 has an input terminal for an I component of the baseband signal, an input terminal for a Q component of the baseband signal, an input terminal for the local oscillation signal, and an RF output terminal. A quadrature modulator shown in FIG. 1A may be used as quadrature modulator 501. Since two input circuits for supplying the baseband signals to quadrature modulator 501 and two signal processing units for generating the DC offset cancellation signals for the I and Q components, respectively, are necessary, the circuit shown in FIG. 7 is almost equivalent to the arrangement in which two sets of the circuit shown in FIG. 5 are provided. However, envelope detecting unit 322 and slope detecting unit 323 are shared by the I component circuit and the Q component circuit. In FIG. 7, the constituent elements which are identical to those shown in FIG. 5 are denoted by the same reference numerals with, if necessary, postfixes for indicating the I or Q component. Postfix "i" is added to the reference numerals of circuit components corresponding to the I component, and postfix "q" is added to the reference numerals of circuit components corresponding to the Q component. In this quadrature modulator module, the sign extraction unit, the switch, the integrator and the digital-to-analog converter are provided for each of the I and Q signal paths.

In the quadrature modulator module shown in FIG. 7, the output signal of quadrature modulator 501 enters envelope detecting unit 322, and the resulting envelope signal then splits into two paths. One path directly feeds the non-inverting input of comparator 404, whilst the other path connects to the comparator inverting input via low pass filter 403. In this way the inverting input of comparator 404 floats at a DC level equivalent to the average level of the RF signal envelope, whilst the non-inverting input responds to the instantaneous envelope value. The stream of the output signals of comparator 404 contains the information about whether the envelope level has risen or fallen in each clock period of comparator 404. This binary signal stream from the comparator output is then fed into both inverting amplifier 412 and non-inverting amplifier 411, resulting in two output signal paths which split and feed the I and Q sections of the DC offset cancellation circuit. In the I section, either the inverted or non-inverted amplifier output is selected by switch 413*i* which is controlled by the sign control input, which is in turn controlled by sign extraction unit 321*i* having a comparator for sensing the sign of the modulator input signal. The output of switch 413*i* is accumulated over successive periods by accumulator 414*i*. The accumulator output provides a DC offset cancellation signal which is supplied to adder 302*i* through digital-to-analog converter 415*i* to cancel the DC offset component at the RF output of quadrature modulator 501. Similarly, the Q section has adder 302*q*, sign extraction unit 321*q*, switch 413*q*, accumulator 414*q*, and digital-to-analog converter 415*q* and functions in the same manner as the I section.

To further explain the superposition process between I and Q signals in the circuit shown in FIG. 7, the output of comparator 404 enters the I and Q sections in parallel. In the case of the I signal, the I signal instantaneous slope (positive or negative) at the RF output can be reconstructed, with a superimposed artifact due to the Q signal, by switching the polarity of the output of envelope detecting unit 322 by the sign of the I signal inside the DC offset cancellation circuit. Similarly, inside the DC offset cancellation circuit, switching the polarity of the envelope signal by the sign of the Q input, reconstructs the Q signal instantaneous slope (positive or negative) at the RF output with the superimposed artifact due to the I signal. If the time constant over which the signals are observed is made sufficiently long, then the superimposed artifacts on the recovered signals will appear as noise, allowing them to be removed by simple filtering. As for this application only the two DC components of the quadrature modulator output constellation are of interest, it is possible to recover the DC components by feeding the recovered output I and Q signals with the artifacts into the integrators 414*i*, 414*q* in the two sections, which perform three functions. First, they will remove the unwanted artifact by averaging it out as noise. Secondly, they will low pass filter the extracted signal, allowing the DC level of the constellation at the output to be extracted as an error signal. Third, the inclusion of an integrator in the loop will allow the loop to converge to a zero error final solution, as the error signal applied to the modulator input will increase until the average detected DC levels from the modulator constellation becomes zero.

Figure 8:
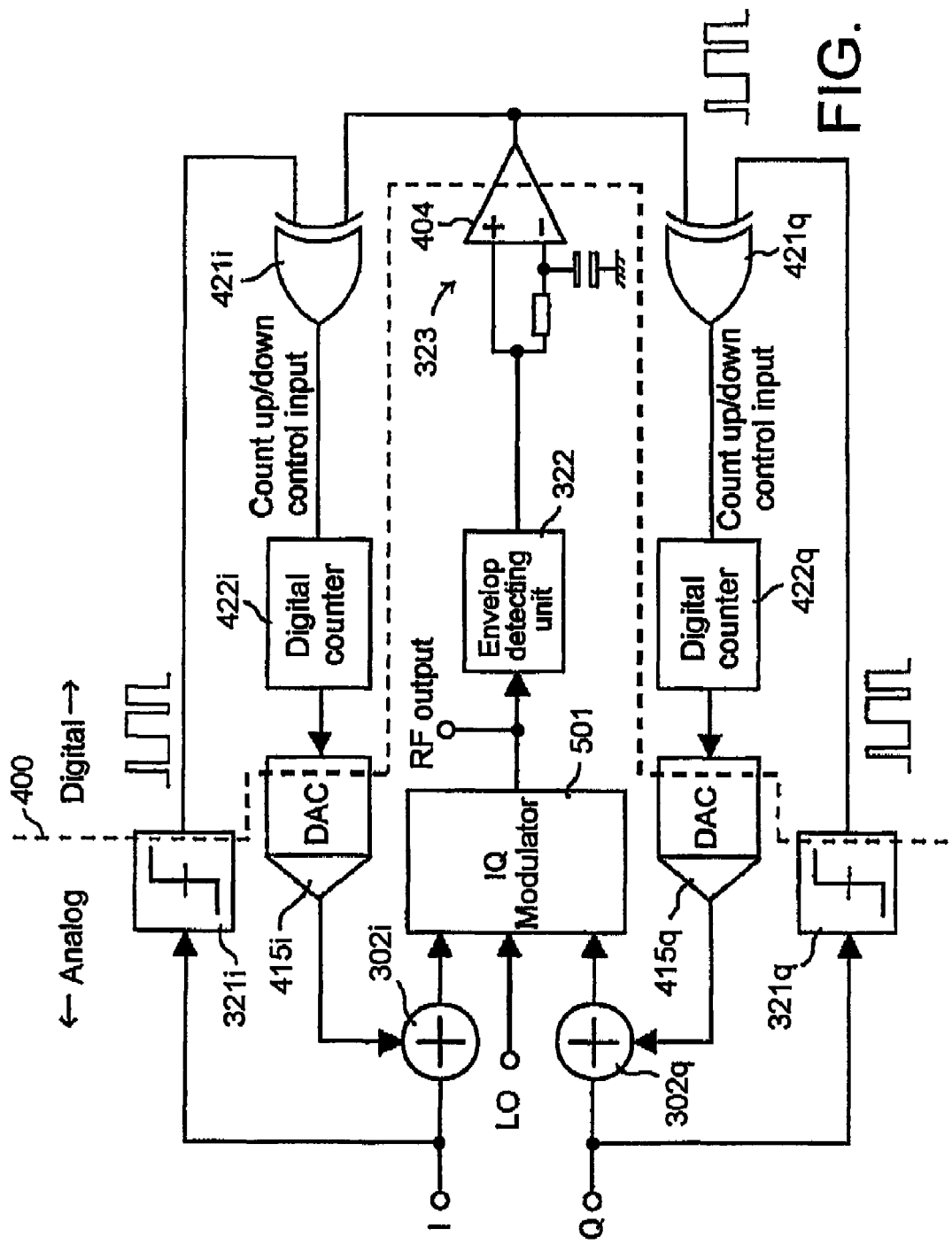
FIG. 8 is a diagram illustrating another quadrature modulator module in which the DC offset cancellation circuits are installed.

FIG. 8 illustrates another quadrature modulator module in which the DC offset cancellation circuit is installed. The DC offset cancellation circuit used in this example is an extended version of the DC offset cancellation circuit shown in FIG. 6. The circuit shown in FIG. 8 is almost equivalent to the arrangement in which two sets of the circuit shown in FIG. 6 are provided for quadrature modulator 501. In FIG. 8, the constituent elements which are identical to those shown in FIG. 6 are denoted by the same reference numerals with, if necessary, postfixes for indicating the I or Q component. The operation of the circuit shown in FIG. 8 is apparent from the above description on the circuits shown FIGS. 6 and 7.

Figure 9:
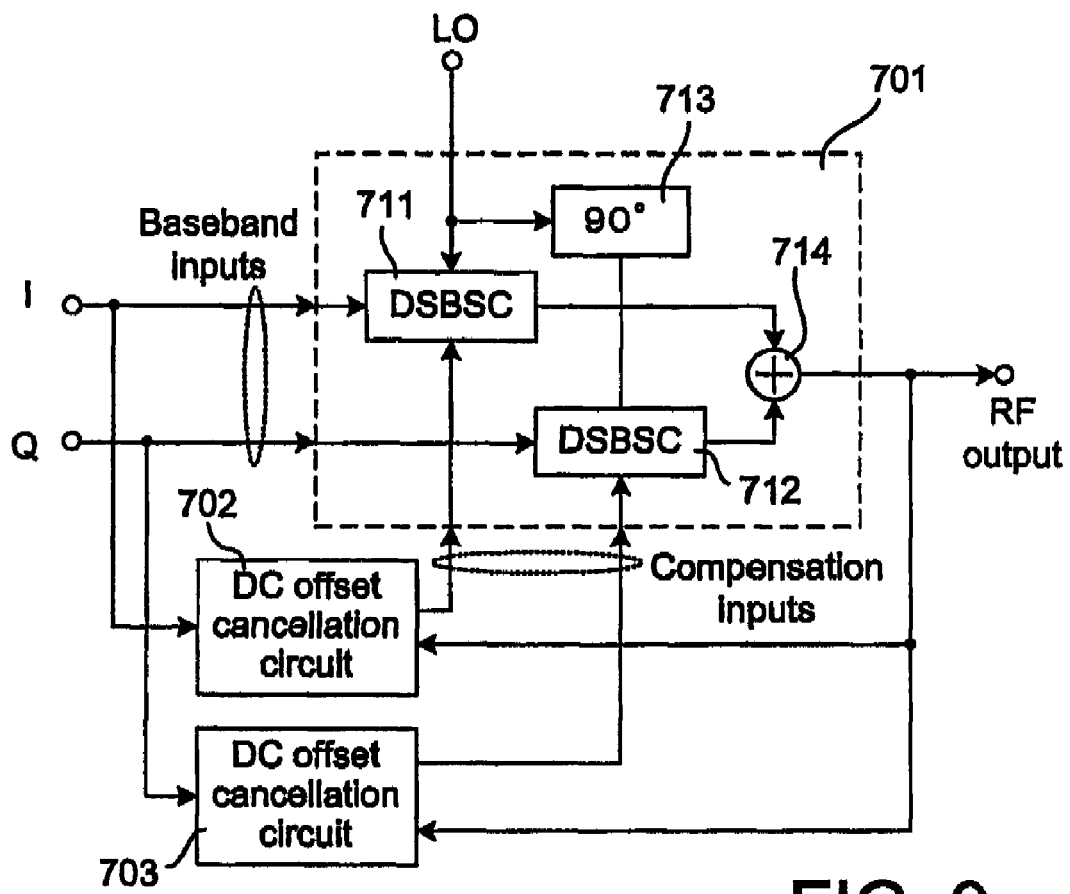
FIG. 9 is a block diagram illustrating a quadrature modulator module in which the DC offset cancellation circuits are connected to compensation inputs of DSBSC modulators.

FIG. 9 illustrates a quadrature modulator module in which quadrature modulator with built-in compensation terminals is used. Quadrature modulator 701 is supplied with I and Q components of the baseband signal and generates an RF output signal. DSBSC mixers 711, 712 each having a compensation input, phase shifter 713 for local oscillation (LO) signal, and combiner 714 for combining the outputs of DSBSC mixers 711, 712 are provided within quadrature modulator 701. DSBSC mixers 711, 712 receives the I signal component and Q signal component, respectively. DC offset cancellation circuit 702 is supplied with the I component and the RF output signal from quadrature modulator 701 and generates a DC offset cancellation signal for the I component which is applied to the compensation input of DSBSC mixer 711. Similarly, DC offset cancellation circuit 703 is supplied with the Q component and the RF output signal and generates a DC offset cancellation signal for the Q component which is applied to the compensation input of DSBSC mixer 712. In the case of compensating a DC offset of the quadrature modulator shown in FIG. 9, the RF output from quadrature modulator 701 enters two DC offset cancellation circuits 702, 703 in parallel. Each of DC offset cancellation circuits 702, 703 has the same configuration as the DC offset cancellation circuit which is described above.

While a preferred embodiment of the present invention has been described using specific terms, such description is for illustrative purposes only, and it is to be understood that changes and variations may be made without departing from the spirit or scope of the following claims.

The invention claimed is:
1. A DC offset cancellation circuit for a modulator, comprising:
   a sign extraction unit for extracting a sign of an information signal which is applied to the modulator;
   an envelope detecting unit for performing envelope detection on an output signal of the modulator to output the resulting envelope signal;
   a slope detecting unit for performing polarity detection on a slope of the envelope signal; and
   a signal processing unit for generating a DC offset cancellation signal based on the result of the sign extraction and the result of the polarity detection.

2. The circuit according to claim 1, wherein the sign extraction unit comprises a comparator which obtains the sign of the information signal.

3. The circuit according to claim 2, wherein the information signal is a baseband signal.

4. The circuit according to claim 1, wherein the DC offset cancellation signal is fed to the modulator for cancelling a DC offset at the output signal of the modulator.

5. The circuit according to claim 1, wherein the slope detecting unit comprises a comparator and a low pass filter, a non-inverting input terminal of the comparator directly receives the envelope signal and an inverting input terminal of the comparator receives the envelope signal through the low pass filter.

6. The circuit according to claim 4, the modulator is a double sideband suppressed carrier modulator.

7. The circuit according to claim 5, wherein the signal processing unit comprises means for multiplying the sign of the information signal by the detected polarity, and means for extracting the DC offset cancellation signal from result of the multiplying.

8. The circuit according to claim 7, wherein the extracting means comprises an accumulator to which the result of multiplying is fed, and a digital-to-analog converter which converts data stored in the accumulator to an analog signal.

9. The circuit according to claim 5, wherein the signal processing unit comprises an XOR logic gate to which a first binary signal corresponding to the sign of the information signal and a second binary signal corresponding to the detected polarity are fed, and means for extracting the DC offset cancellation signal from an output of the XOR logic gate.

10. The circuit according to claim 9, wherein the extracting means comprises a digital up/down counter which counts a clock signal, and a digital-to-analog converter which converts an output of the digital up/down counter to an analog signal, and wherein up counting and down counting of the digital up/down counter is controlled by the output of the XOR logic gate.

11. A modulator module comprising a modulator and a DC offset cancellation circuit, wherein the DC offset cancellation circuit comprises:
a sign extraction unit for extracting a sign of an information signal which is applied to the modulator;
an envelope detecting unit for performing envelope detection on a signal supplied from the modulator to output the resulting envelope signal;
a slope detecting unit for performing polarity detection on a slope of the envelope signal; and
a signal processing unit for generating a DC offset cancellation signal based on the result of the sign extraction and the result of the polarity detection, the DC offset cancellation signal being fed to the modulator.

12. The modulator module according to claim 11, wherein the modulator is a double sideband suppressed carrier modulator.

13. The modulator module according to claim 12, wherein the modulator has a built-in compensation terminal to which the DC offset cancellation signal is applied.

14. A quadrature modulator comprising a two sets of the modulator module according to claim 11, wherein an output of the quadrature modulator is supplied the envelope detecting units.

15. A quadrature modulator comprising a two sets of the modulator module according to claim 13, wherein an output of the quadrature modulator is supplied the envelope detecting units.

16. A quadrature modulator module comprising:
a quadrature modulator comprising a first modulator receiving a first information signal, a second modulator receiving a second information signal, and an adder adding outputs of the first modulator and the second modulator to output an RF signal;
an envelope detecting unit for performing envelope detection on the RF signal to output the resulting envelope signal;
a slope detecting unit for performing polarity detection on a slope of the envelope signal;
a first sign extraction unit for extracting a sign of the first information signal;
a second sign extraction unit for extracting a sign of the second information signal;
a first signal processing unit for generating a first DC offset cancellation signal based on the result of the sign extraction in the first sign extraction unit and the result of the polarity detection, the first DC offset cancellation signal being fed to the first modulator; and
a second signal processing unit for generating a second DC offset cancellation signal based on the result of the sign extraction in the second sign extraction unit and the result of the polarity detection, the second DC offset cancellation signal being fed to the second modulator.

17. The module according to claim 16, wherein each of the first and second modulators is a double sideband suppressed carrier modulator having a built-in compensation terminal to which the DC offset cancellation signal is applied.

18. A method for suppressing a carrier leak at an output signal of a modulator, comprising the steps of:
extracting a sign of an information signal which is applied to the modulator;
detecting an envelope of an output signal of the modulator;
detecting a polarity of a slope of the envelope;
calculating a DC offset cancellation signal for compensating the carrier leak at an output of the modulator by using multiplication of the sign of the information signal by the polarity of the slope of the envelope; and
applying the DC offset cancellation signal to the modulator to suppress the carrier leak.

* * * * *